United States Patent
Miyazaki et al.

(10) Patent No.: US 7,935,185 B2
(45) Date of Patent: May 3, 2011

(54) FILM FORMING SYSTEM AND FILM FORMING METHOD

(75) Inventors: Shinji Miyazaki, Kamakura (JP); Hiroki Fukushima, Tokyo-To (JP)

(73) Assignees: Kabushiki Kaisha Toshiba, Tokyo (JP); Tokyo Electron Limited, Tokyo-To (JP)

(*) Notice: Subject to any disclaimer, the term of this patent is extended or adjusted under 35 U.S.C. 154(b) by 1328 days.

(21) Appl. No.: 11/229,841

(22) Filed: Sep. 20, 2005

(65) Prior Publication Data

US 2006/0081181 A1 Apr. 20, 2006

(30) Foreign Application Priority Data

Sep. 21, 2004 (JP) .................. 2004-272996

(51) Int. Cl.
C23C 16/00 (2006.01)
F27D 3/12 (2006.01)

(52) U.S. Cl. ........ 118/715; 118/719; 118/722; 414/937; 414/938; 414/940; 432/241

(58) Field of Classification Search .................. 118/715, 118/719, 722; 414/937, 938, 940; 432/241
See application file for complete search history.

(56) References Cited

U.S. PATENT DOCUMENTS

| | | | |
|---|---|---|---|
| 5,378,283 A * | 1/1995 | Ushikawa ................... | 118/719 |
| 5,536,320 A * | 7/1996 | Ushikawa et al. ........... | 118/719 |
| 6,038,788 A | 3/2000 | Chang | |
| 2003/0049372 A1 * | 3/2003 | Cook et al. ................. | 427/248.1 |

FOREIGN PATENT DOCUMENTS

| | | |
|---|---|---|
| JP | 04-269824 | 9/1992 |
| JP | 6-132224 | 5/1994 |
| JP | 7-161656 | 6/1995 |
| JP | 8-31909 | 2/1996 |
| JP | 10-050806 | 2/1998 |
| JP | 2003-282452 | 10/2003 |

OTHER PUBLICATIONS

Japanese Office Action mailed May 19, 2009 for a corresponding application JP2004-272996 (w/English translation).
Japanese Office Action mailed Jun. 25, 2007 for a corresponding application JP2004-272996 (w/English translation).

* cited by examiner

*Primary Examiner* — Timothy H Meeks
*Assistant Examiner* — Cachet I Sellman
(74) *Attorney, Agent, or Firm* — Smith, Gambrell & Russell, LLP (57) ABSTRACT

A clean gas circulates to pass through a loading area provided below a vertical heat treatment furnace. The clean gas unidirectionally flows through the loading area. After completion of wafer processing, a wafer boat lowers from the heat treatment furnace to the loading area, where the wafers are removed from the wafer boat. Subsequently, a clean gas jetting nozzle arranged in the loading area jets a clean gas toward the emptied wafer boat. Fragment of thin film which may readily peel off are blown away from the wafer boat, and are discharged out of the loading area together with the unidirectional flow. Thus, it is possible to avoid wafer contamination due to the unexpected peel-off of thin film fragments from the wafer boat.

6 Claims, 6 Drawing Sheets

FILM FORMING SYSTEM AND FILM FORMING METHOD

BACKGROUND OF THE INVENTION

1. Field of the Invention

The present invention relates to a film forming system and method for performing a film formation process to process objects such as semiconductor wafers.

2. Description of the Related Act

In general, a vertical heat treatment system, which is advantageous for dust elimination and space saving, is used as a heat treatment system for performing a thermal diffusion process or a film formation process for semiconductor device manufacturing (refer to Japanese patent laid-open publications JP4-269824A and JP2003-282452A, for example).

Such a vertical heat treatment system includes a heat treatment furnace vertically housed in an upper section of a rectangular housing, and having a cylindrical reaction tube made of quartz, and a heater and thermal insulator which are disposed around the reaction tube. A standby space, allowing a wafer boat carrying many semiconductor wafers (i.e., process objects) thereon to stand by, is provided in the housing below the heat treatment furnace. The wafer boat is loaded into and unloaded from the heat treatment furnace by means of a boat elevator. Due to the above structure, the vertical heat treatment system is advantageous for footprint reduction, as compared with a horizontal heat treatment apparatus including a horizontal heat treatment furnace. In addition, in the vertical heat treatment system, the wafer boat can be loaded into and unloaded from the heat treatment furnace without colliding with the reaction tube, and thus the generation of particles can be minimized.

In order to achieve an increased degree of cleanness, the vertical heat treatment system employs a dust elimination filter, through which a clean gas is supplied to the standby space to pass through the entire standby space, thereby preventing particles or dust from adhering to the semiconductor wafers in the standby space. Part of the clean gas passed through the standby space is circulated, while the remaining part of the clean gas is discharged out of the system to an exhaust system.

Recently, a higher degree of cleanness (particle elimination) is required to meet the requirements of a higher degree of miniaturization and integration of semiconductor devices and efficient mass production.

A film formation process forms thin films not only on the semiconductor wafers but also on the entire surface of the wafer boat. The unnecessary thin film formed on the wafer boat surface can be removed by a cleaning process, which is performed every time after the wafer boat is used for the film formation process for a certain times. However, in areas where the wafers contact the wafer boat, the thin film formed on the edge of each wafer is connected to the thin film formed on the wafer boat. Thus, when the wafer is removed from the wafer boat, the connection is broken so that fragments of the thin film exist on the wafer boat surface. The fragments can readily be removed from the wafer boat surface, and are likely to adhere to a subsequently processed wafer to contaminate it with particles originated from the fragments.

SUMMARY OF THE INVENTION

The present invention has been made in view of the above circumstances and provides an effective solution to the problem described above. It is therefore an object of the present invention to provide a system and a method which is capable of forcibly removing unnecessary thin film ready to be removed, in order to prevent process objects from being contaminated with particles originated from the thin films.

According to the first aspect of the present invention, there is provided a film forming system including: a heat treatment furnace adapted to perform a film formation process and including a vertical heat processing vessel and a heater arranged around the processing vessel, the processing vessel being adapted to be evacuated and adapted to accommodate a plurality of process objects therein; a support boat adapted to support the plurality of process objects at vertical intervals; a boat elevating mechanism adapted to move the support boat vertically to allow the support boat to be loaded into and unloaded from the processing vessel; a standby space, arranged below the heat treatment furnace, where the process objects are carried into and removed from the support boat located below the processing vessel; a clean gas circulation system adapted to generate a circulation flow of a clean gas which passes unidirectionally through the standby space; and a clean gas injector adapted to jet a clean gas toward the support boat without carrying the process objects located in the standby space.

The film forming system may further include a clean gas supply system arranged independently of the clean gas circulation system, and adapted to supply the clean gas to the clean gas injector.

Alternatively, film forming system may by constituted so that a clean gas injector is connected to clean gas circulation system such that a part of the clean gas flowing through a clean gas passage of the clean gas supply system is drawn therefrom, pressurized, and supplied to the clean gas injector.

Preferably, the clean gas injector is configured so that the clean gas injector jets the clean gas in a direction in which the circulation flow of the clean gas generated by the clean gas circulation system flows in the standby space.

The clean gas injector may include a gas jetting nozzle extending vertically and having a plurality of gas jetting holes. Preferably, the gas jetting holes are arranged such that the jetting holes jet the clean air toward a pillar of the support boat.

According to the second aspect of the present invention, there is provided a film forming method including: carrying process objects in a support boat so that the support boat supports the process objects thereon at vertical intervals; raising the support boat supporting the process objects to load the process objects into a processing vessel; performing a film formation process to the process objects having been loaded into the processing vessel; lowering the support boat to unload the process objects, having been subjected to the film formation process, from the processing vessel; removing the process objects, having been subjected to the film formation process, from the support boat to empty the same; and jetting a clean gas toward the support boat, having been emptied, to blow particles off the support boat.

DETAILED DESCRIPTION OF THE PREFERRED EMBODIMENTS

The embodiments of a film forming system and method according to the present invention will be described with reference to the accompanying drawings.

Figure 1:
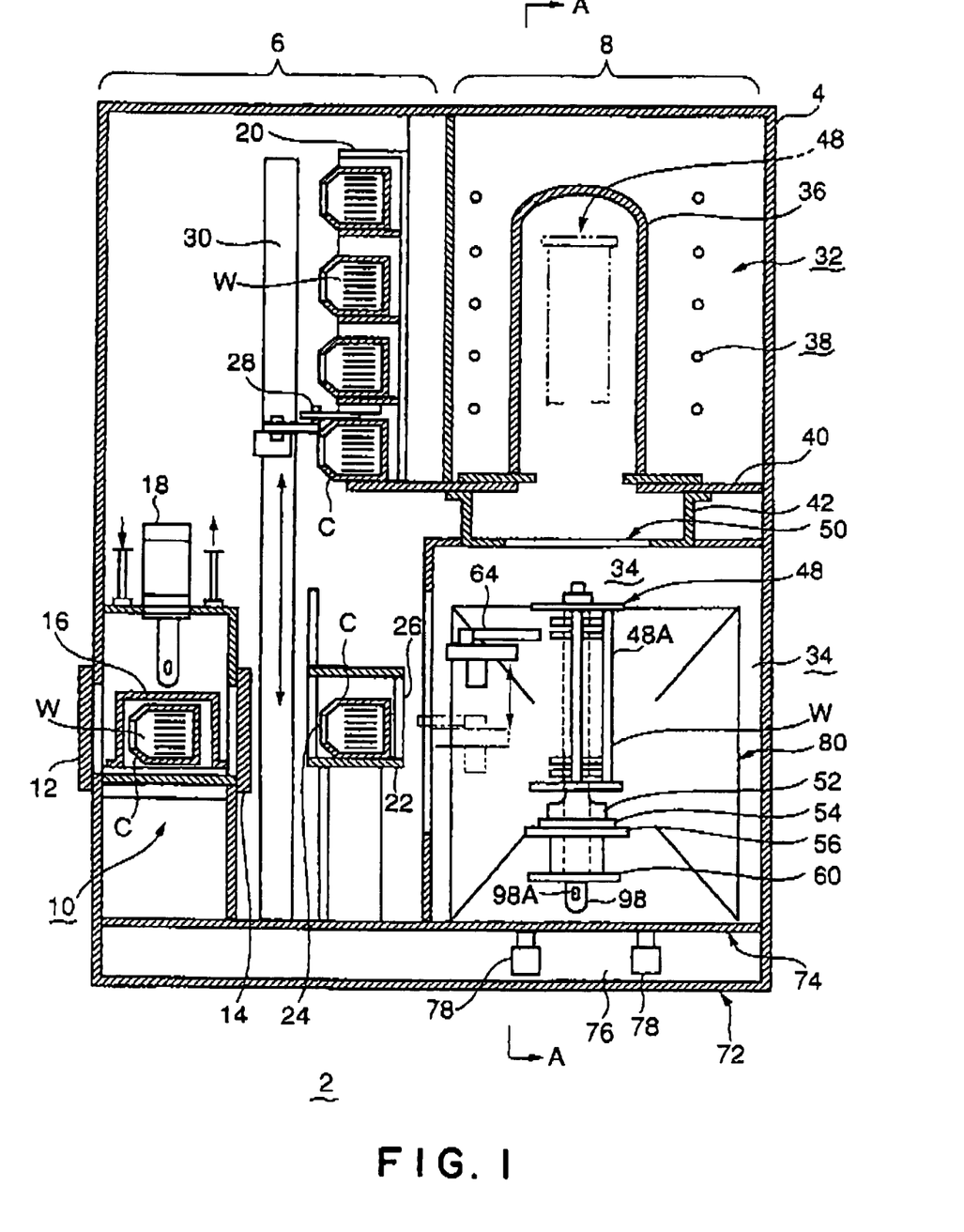
FIG. 1 is a schematic side view showing the overall configuration of a film forming system according to the present invention.
Figure 2:
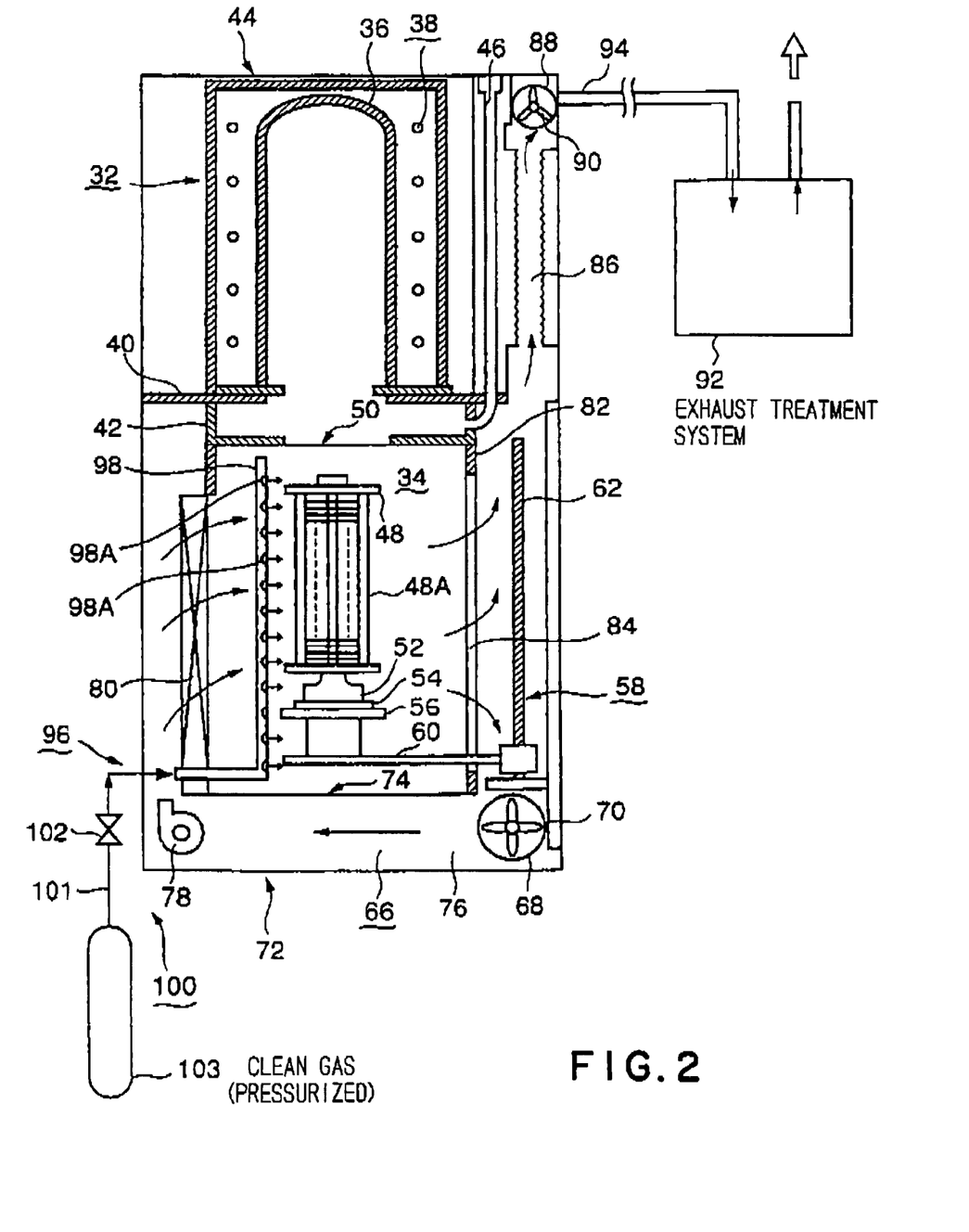
FIG. 2 is a cross-sectional view taken along section A-A of FIG. 1.
Figure 3:
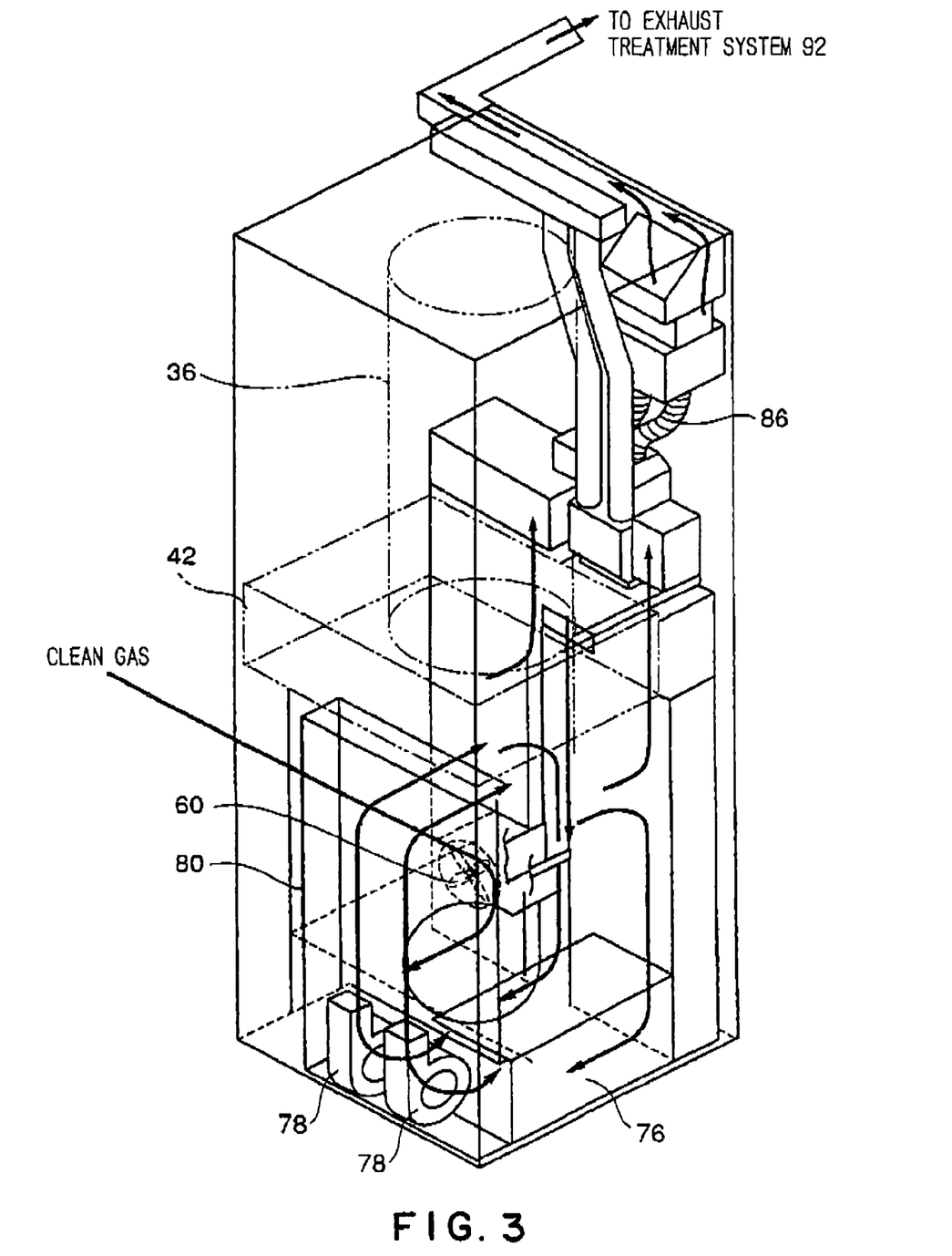
FIG. 3 is a perspective view showing the flows of a clean gas in main portions of the film forming system.
Figure 4:
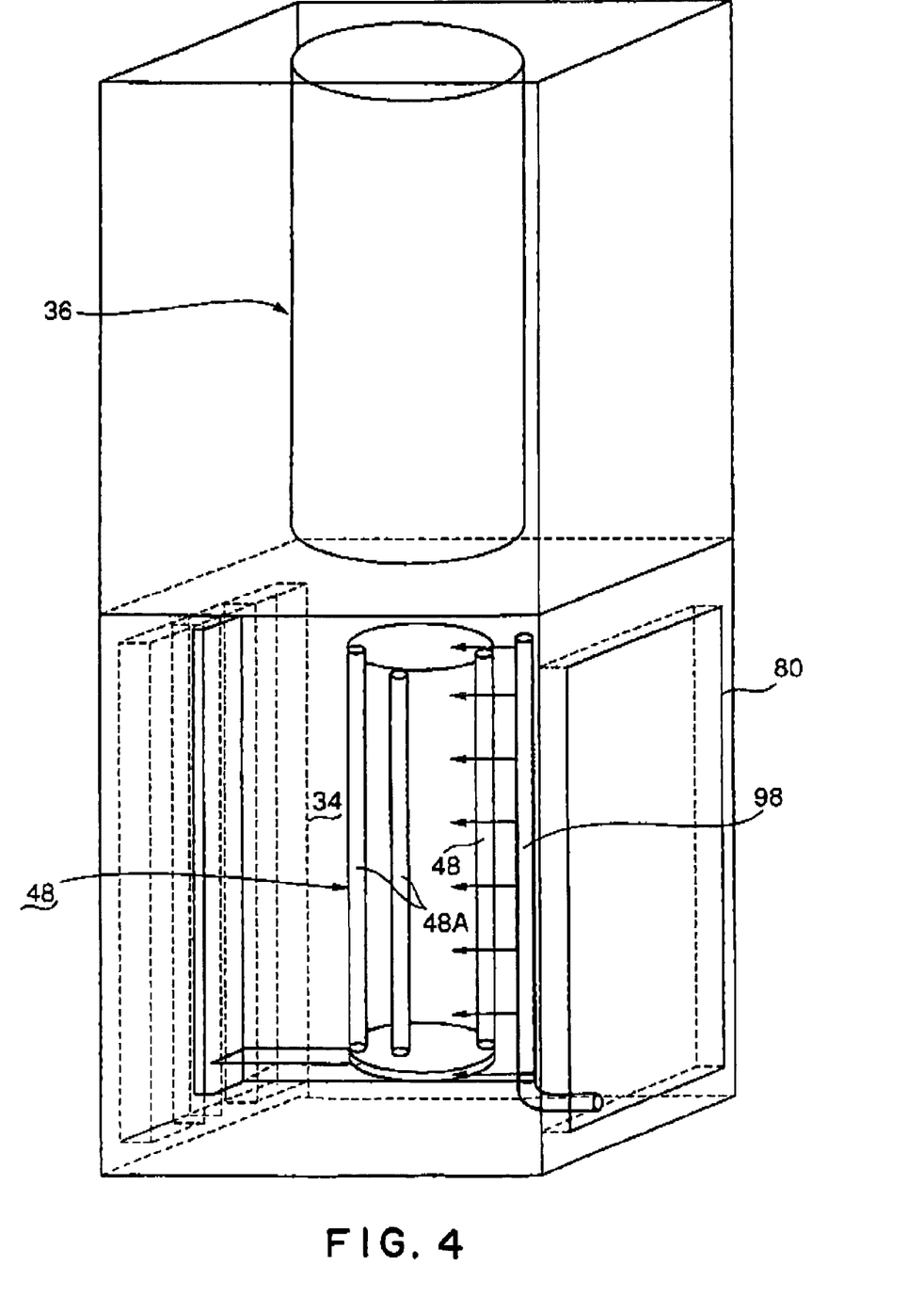
FIG. 4 is a perspective view showing the arrangement of a jetting nozzle of a clean gas injector.
Figure 5:
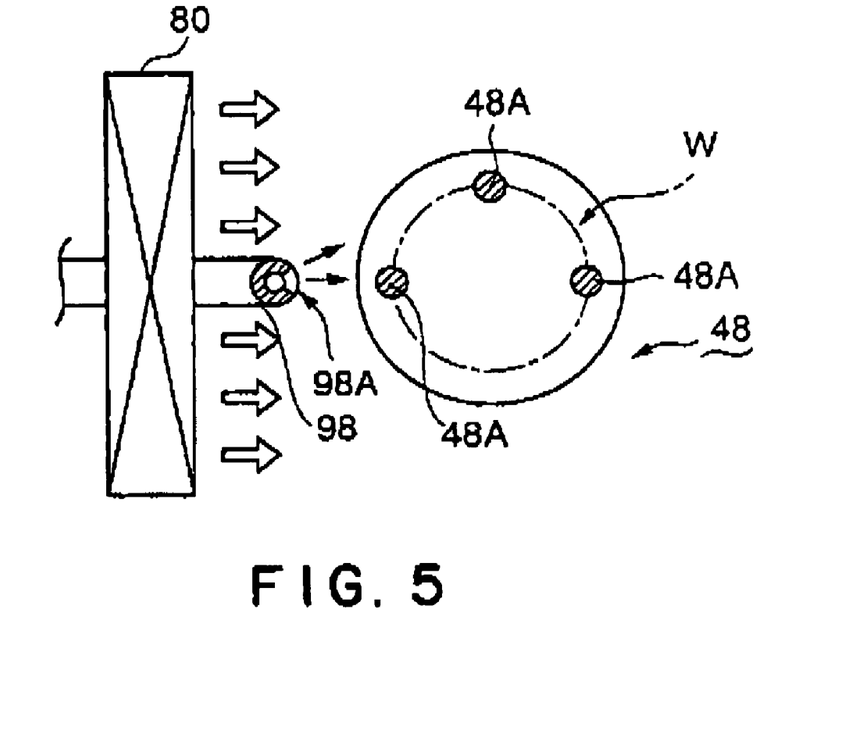
FIG. 5 is a horizontal cross-sectional view showing the positional relationship between a jetting nozzle and a support boat in a standby space.

FIG. 1 is a schematic side view showing the overall configuration of a film forming system according to the present invention; FIG. 2 is a cross-sectional view taken along section A-A of FIG. 1; FIG. 3 is a perspective view showing the flows of a clean gas in main portions of the film forming system; FIG. 4 is a perspective view showing the arrangement of a jetting nozzle of a clean gas injector; and FIG. 5 is a horizontal cross-sectional view showing the positional relationship between a jetting nozzle and a support boat in a standby spate.

As shown in FIG. 1, the film forming system 2 is entirely enclosed by a rectangular housing 4, which may be made of a stainless steel. The interior of the housing 4 is roughly divided into a wafer transport area 6 and a wafer heat treatment area S. The transport area 6 receives semiconductor wafers W as process objects, and temporarily stores them. A film formation process to the wafer W is performed in the heat treatment area 8.

An in-and-out port (hereinafter abbreviated as "I/O port") 10, which can be hermetically closed, is provided at the front end of the wafer transport area 6 for carrying-in and carrying-out of the wafers W. Doors 12, 14 are provided on the opposite sides of the I/O port 10. A plurality of semiconductor wafers W are supported and vertically arrayed in a cassette C, which can accommodate a plurality of, e.g., 25, wafers. The cassette C is transported while it is placed in an airtight transport box 16, which can be opened and closed. FIG. 1 shows that the airtight transport box 16 is carried into the I/O port 10 via the outer door 12. The transport box 16 is filled with a clean gas such as an inert gas (e.g., nitrogen gas) or clean air. A box opening-and-closing mechanism 18 is arranged at the upper portion of the I/O port 10 to open and close the transport box 16.

A shelf-like, carrier stocker 20 is arranged in an upper region of the wafer transport area 6. The carrier stocker 20 may be used for temporarily storing a carrier C. A carrier pass box 22 is arranged below the carrier stocker 20, and is positioned near the boundary between the wafer transport area 6 and wafer heat treatment area 8. The carrier pass box 22 holds the carrier C when the wafers W are transferred between the wafer transport area 6 and the heat treatment area 8. The carrier pass box 22 is also provided with doors 24, 26 on the opposite sides thereof. The doors 24, 26 open and close when needed for transferring a carrier C or wafers W.

A carrier transport arm 28, which is capable of bending and stretching and of turning, is provided between the I/O port 10, and carrier stocker 20 and carrier pass box 22. The carrier transport arm 28 moves up and down along a carrier elevator 30, which can move in a horizontal direction. Thus, the carrier C can be transported among the I/O port 10, carrier stocker 20, and carrier pass box 22. A clean gas such as an inert gas (e.g., nitrogen gas) or clean air flows downward in the entire wafer transport area 6.

As shown in FIG. 2, the wafer heat treatment area 8 is generally divided into a heat treatment furnace 32 and a standby space 34. The heat treatment furnace 32 is positioned above the standby space 34. The heat treatment furnace 32 includes a vertical processing vessel 36, which can be evacuated. The processing vessel 36, which may be made of quartz, is formed in a cylinder having a closed top and an opened bottom. The processing vessel 36 can accommodate a plurality of semiconductor wafers W therein. A heater 38 is provided around the processing vessel 36 to heat the wafers W in the processing vessel 36. A thermal insulator (not shown) is arranged on the outer circumference of the heater 38 to improve the thermal efficiency. The lower end of the processing vessel 36 is mounted to a base plate 40, which may be made of a stainless steel. In some conventional furnaces, a stainless steel manifold is coupled to the lower end of the processing vessel, which configuration may be used herein.

A box-shaped scavenger 42, which may be made of a stainless steel, is mounted below the base plate 40 to discharge a high-temperature gas remaining in the processing vessel 36 and coming out from the processing vessel 36 through the lower end opening thereof. A thermal exhaust duct 46 (see FIG. 2) is connected to a side of the scavenger 42, and extends to a housing ceiling 44. A through-hole 50 is formed in a central part of the scavenger 42 to allow a support boat 48 to be loaded to and unloaded from the processing vessel 36. The support boat 48, which may be made of quartz, is positioned below the scavenger 42. A shutter (not shown) is provided to close the lower end opening of the processing vessel 36 when the support boat 48 is lowered.

Arranged below the scavenger 42 is the standby space 34 where semiconductor wafers W to be loaded into the processing vessel 36, or unloaded from the processing vessel 36 stand by. The support boat 48 is held in the standby space 34 while being supported on a thermal insulation cylinder 52 which may be made of quartz. The support boat 48 supports many semiconductor wafers 12 at vertical regular intervals.

The thermal insulation cylinder 52 is fastened to a turntable 54, which is rotatable by drive means (not shown). A disc-shaped cap 56 is positioned below the turntable 54 to hermetically close the lower end opening the processing vessel 36. The thermal insulation cylinder 52, turntable 54, and the cap 56 are integrated, and are mounted on an arm 60 of a boat elevating mechanism 58 (see FIG. 2), which is positioned on one side of the standby space 34. The boat elevating mechanism 58 includes a guide shaft 62 extending in a vertical direction, which is driven for rotation by means of a motor such as a stepping motor (not shown). The proximal end of the arm 60 and the guide shaft 62 constitute a ball-screw mechanism. Thus, the arm 60 moves vertically by rotating the guide shaft 62, so that the support boat 48 and the related component parts integrally move up and down.

Arranged also in the standby space 34 is a wafer transfer arm 64, which faces the carrier pass box 22 in the wafer transport area 6, and which is capable of bending-and-stretching operation, turning movement, and vertical movement. Thus, the wafer transfer arm 64 is capable of transferring the wafers W between the carrier C in the carrier pass box 22 and the support boat 48 lowered into the standby space 34.

The film forming system 2 further includes a clean gas circulation system 66, which generate a circulation flow of a clean gas, which passes unidirectionally through the entire standby space 34. More specifically, a wall below the boat elevating mechanism 58 is provided with a clean gas inlet port 68 for introducing a clean gas to be supplied into the standby space 34. A blower fan 70, which is a part of the clean air circulation system 66, is mounted to the inlet port 68 to forcibly feed the clean gas into the housing 4. A flow rate adjustment damper (not shown) is installed near the blower fan 70 to adjust the flow rate of a clean gas supplied to the standby space 34, A bottom partition 74, which may be made of a steel plate, is arranged in the bottom part of the housing 4 while being vertically spaced apart from the housing bottom plate 72, so that an air flow path 76, through which the clean gas thus introduced from one side (first side) of the bottom of the housing 4 is fed to the other side (second side) of the bottom of the housing 4, is formed between the housing bottom plate 72 and the bottom partition 74. One or more fan units 78 (in the illustrated embodiment, two) are installed on the second side (i.e., the left-hand side in FIG. 2) in the air flow path 76 in order to blow the clean gas fed thereto upward. A punching metal is (not shown) arranged above the fan units 78 to face the standby space 34. A dust elimination filter 80 such as a HEPA (High Efficiency Particulate Air) filter is attached to the punching metal. Due to the provision of the filter 80, the clean gas flown into the standby space 34 through the filter 80 flows horizontally (unidirectionally) through the standby space 34. The width of the filter 80 is substantially the same as that of the support boat 48. Apertures of the punching metal are formed only in a portion to which the filter 80 is attached. This configuration ensures that the clean gas unidirectionally flows through the substantially entire area of the standby space 34. In this instance, the direction of clean gas flow is perpendicular to the direction in which the wafer transfer arm 64 bends and stretches (i.e., carry-in-and-out direction).

An elevator cover 82, which may be made of a stainless steel, is provided on the side opposite to the filter 80 to cover the boat elevating mechanism 58. A slit 84, extending vertically, is formed in the elevator cover 82. The arm 60 of the boat elevating mechanism 58 passes through the slit 84. A clean gas exhaust path 86 is arranged above the space around the boat elevating mechanism 58 facing the elevator cover 82. The clean gas exhaust path 86 guides part of the clean gas passed through the standby space 34 toward the housing ceiling 44. The remaining part of the clean gas flows into the air flow path 76 arranged at the housing bottom, and recirculates into the standby space 34. An exhaust port 88 is arranged at the top portion of the housing 4 corresponding to the upper end of the exhaust path 86 in order to discharge the clean gas passed through the standby space 34 from the housing 4. The exhaust port 88 is provided with an exhaust fan 90, which promotes the exhaust of the clean gas. The exhaust port 88 is connected to an exhaust treatment duct 94, which guides the exhaust gas to an external exhaust treatment system 92 which may include emission-cleaning device.

The standby space 34 is provided therein with a clean gas injector 96. The clean gas injector 96 intensively jets the clean gas into the support boat 48 in the standby space 34 emptied of the semiconductor wafers W. More specifically, the clean gas injector 96 includes a jetting nozzle 98 arranged between the filter 80 and lowered support boat 48, as shown in FIGS. 4 and 5. The jetting nozzle 98 extends in the longitudinal direction (vertical direction) of the support boat 48. Plural gas jetting holes 98A are formed in the jetting nozzle 98. The gas injection holes 98A are arrayed in the longitudinal direction of the jetting nozzle 98 at vertical intervals. The gas jetting holes 98A horizontally jet a clean gas toward the lowered support boat 48.

The direction in which clean gas is jetted from the gas jetting holes 98A is substantially the same as the direction of the clean gas flow in the standby space 34, which prevents a disturbed gas flow. The gas injection holes 98A are arranged at least in a part of the jetting nozzle 98 corresponding to the entire length (height) of the support boat 48, so that the whole length of the support boat 48 is exposed the jetted clean gas. Preferably, the clean gas is jetted toward pillars 48A of the support boat 48 which retains the wafers.

The base end of the jetting nozzle 98 may be supported by the sidewall of the housing 4, and is connected to a clean gas supply system 100, which is independent of the clean gas circulation system 66. The clean gas supply system 100 includes a gas line 101 connected to the base end the jetting nozzle 98, and a gas supply source 103 connected to the gas line 101. The gas line 101 is provided with a shutoff valve 102. When the shutoff valve 102 is opened, the jetting nozzle 98 jets the clean gas. The clean air supplied by the gas supply source 103 is pressurized, so that the flow velocity of the clean gas jetted from the gas injection holes 98A is higher than that of the unidirectional flow in the standby space 34 caused by the clean gas circulation system 66, the former being in the range of about 4.0 to 7.0 m/sec, and the latter being about 0.25 to 0.35 m/sec, for example. Clean air or a clean inert gas such as nitrogen, argon and helium may be used as the clean gas.

The film forming method performed by using the aforementioned film forming system will be described.

Referring to FIG. 1, a cassette C holding unprocessed semiconductor wafers W is housed in the airtight transport box 16. The transport box 16 is then carried into the I/O port 10 via the outer door 12. The cassette C may be transported without using the transport box 16, namely, with the cassette C being exposed to the atmosphere. The transport box 16 is opened by the box opening-and-closing mechanism 18 provided at the I/O port 10. The cassette C in the transport box 16 is carried into the interior of the transport area 6 via the outer door 14 by means of the carrier transport arm 28. The cassette C may be temporarily stored in the carrier stocker 20 when needed. The carrier transport arm 28 transports a cassettes C holding wafers W to be processed into the carrier pass box 22. The carrier C may be directly transported from the I/O port 10 to the carrier pass box-22.

The support boat 48 has been lowered into the standby space 34 and emptied. The unprocessed wafers W in the carrier C in the carrier pass box 22 are transferred to the empty support boat 48 by the wafer transfer arm 64 (carrying-in step). In the carrying-in step and all the subsequent steps, there is a unidirectional side flow in the substantially whole area of the standby space 34.

When a predetermined number of wafers W are transferred to the support boat 48, the boat elevating mechanism 58 (see FIG. 2) is driven to raise the support boat 48 and place it in the processing vessel 36. When the wafers W are loaded into the processing vessel 36 in this manner, the processing vessel 36 is hermetically closed (loading step).

The processing vessel 36 is preheated in accordance with the film formation process to be performed. After the wafers W are loaded, the wafer temperature is raised to a film formation temperature and then maintained. A predetermined film formation gas is supplied into the processing vessel 36, while the processing vessel 36 is evacuated so that the pressure in the processing vessel 36 is maintained at a predetermined process pressure. In this manner, a film formation process is performed to deposit thin films on the wafer surfaces (film formation step).

When the film formation process is performed for a predetermined period of time and thus is completed, the boat elevating mechanism 58 (see FIG. 2) is driven to lower the support boat 48. The processed wafers W are thus unloaded from the processing vessel 36 to the standby space 34 (unloading step). In this instance, a remaining hot gas flows out of the processing vessel 36 through the lower end opening of the processing vessel 36. The scavenger 42 attached to the opening discharges the remaining gas out of the film forming system 2. The wafers W, which has been subjected to the film formation process and unloaded into the standby space 34, are removed from the support boat 48 by the wafer transfer arm 64 and sequentially transferred into the empty carrier C in the carrier pass box 22, one by one. This transfer operation is repeated until the support boat 48 is emptied (carrying-out step).

Although a conventional film forming method performs the carrying-in step again for carrying next unprocessed wafers W into the empty support boat 48 after completion of the carrying-out step, the method according to the present invention jets a clean gas toward the support boat 48 before performing the carrying-in step.

The jetting step will be described in detail. As mentioned above, a clean gas side flow is constantly formed in the standby space 34. In other words, the blower fan 70, fan units 78 and exhaust fan 90, which are installed at various locations in the wafer heat treatment area 8, are always driven. Therefore, the clean gas taken in from the clean gas inlet port 68 passes through the air flow path 76 at the bottom portion of the housing 4, is blown upward by the fan units 78, passes through the dust elimination filter 80, and flows horizontally from one side of the standby space 34 to form a side flow, as shown in FIG. 2. The side flow flows near the semiconductor wafers W standing by in the standby space 34, in order to prevent dust from adhering to the semiconductor wafers W. The flow rate is preferably in the range of 0.25 to 0.35 m/sec, so that no turbulent flow and no stagnation of gas occur in the standby space 34. Part of the clean gas, which has left the standby space 34, flows upward through the clean gas exhaust path 86, and is processed by the exhaust treatment system 92.

The remaining part of the clean gas is used again. More specifically, the remaining part of the clean gas, which has left the standby space 34, flows downward to go back into the air flow path 76, and is fed to the standby space 34 by means of the blower fan 70 and the fan units 78. The associated clean gas flow is shown in FIG. 3.

The jetting step is performed after the wafers W are subjected to the film formation process and are removed from the support boat 48. In the jetting step, the pressurized clean gas is supplied from the clean gas supply system 100 and then jetted toward the support boat 48 from the gas injection holes 98A of the jetting nozzle 98. The jetting velocity of clean gas from the jetting nozzle 98 is higher than that of unidirectional flow in the standby space 34. Thus, particles adhered to the support boat 48 and unnecessary film, which has been deposited on the support boat 48 and may readily peel off, are blown away by the clean gas jet. Specifically, unnecessary film fragments and the like, which are generated when the processed wafers W are removed and may readily fall off, exist on the pillars 48A which support wafers. When a strong jet of clean gas is blown to the pillars 48A under the above condition, the unnecessary film fragments and the like are forcibly removed. As a result, it is possible to prevent particles from adhering to the surfaces of newly incoming wafers.

Particles originated from the film fragments and removed by the jet of clean gas are discharged out of the system via the clean gas exhaust path 86, or flow together with the clean gas returning to the standby space 34 and are trapped by the filter 80.

As the flowing direction of the unidirectional clean gas flow (side flow) in the standby space 34 is the same as that of the clean gas jet from the jetting nozzle 98. Therefore, it is possible to avoid a turbulent flow in the standby space 34.

Figure 6:
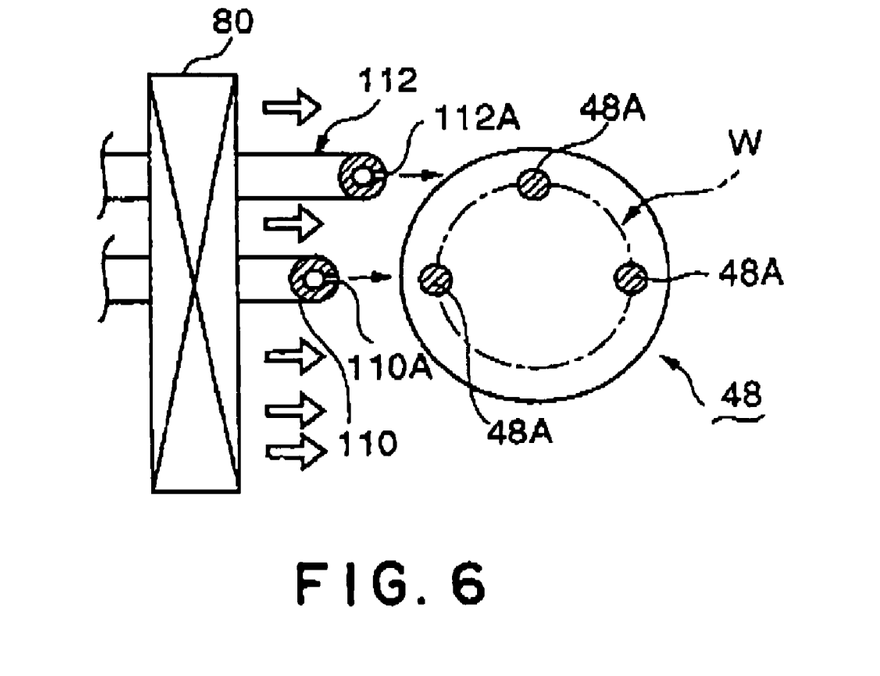
FIG. 6 is a horizontal cross-sectional view showing the positional relationship between two jetting nozzle and a support boat in a standby space.

In the foregoing embodiment, one jetting nozzle 98 (see FIGS. 4 and 5) is provided as the clean gas injector 96. Alternatively, a plurality of jetting nozzles may be provided. FIG. 6 is a horizontal cross-sectional view showing the positional relationship between the jetting nozzles and the support boat in a case where two jetting nozzles 110, 112 are provided. The inside diameters of gas injection holes 110A, 112A in the jetting nozzles 110, 112 are smaller than the inside diameter of the aforementioned gas injection holes 98A. As a result, the directivity of the clean gas jet is increased. When such a clean gas jet is blown toward the pillars 48A of the support boat 48, thin film fragments and the like, which may readily come off the pillars 48A, can be removed with increased efficiency. In FIG. 6, two pillars 48A are serially arranged along the flow of the jet from one jetting nozzle 110. The jet from the jetting nozzle 110 can remove thin film fragments and the like from these two pillars 48A. The number of the jetting nozzles may be determined depending on the number of pillars 48A, and thus three jetting nozzles may be provided.

Figure 7:
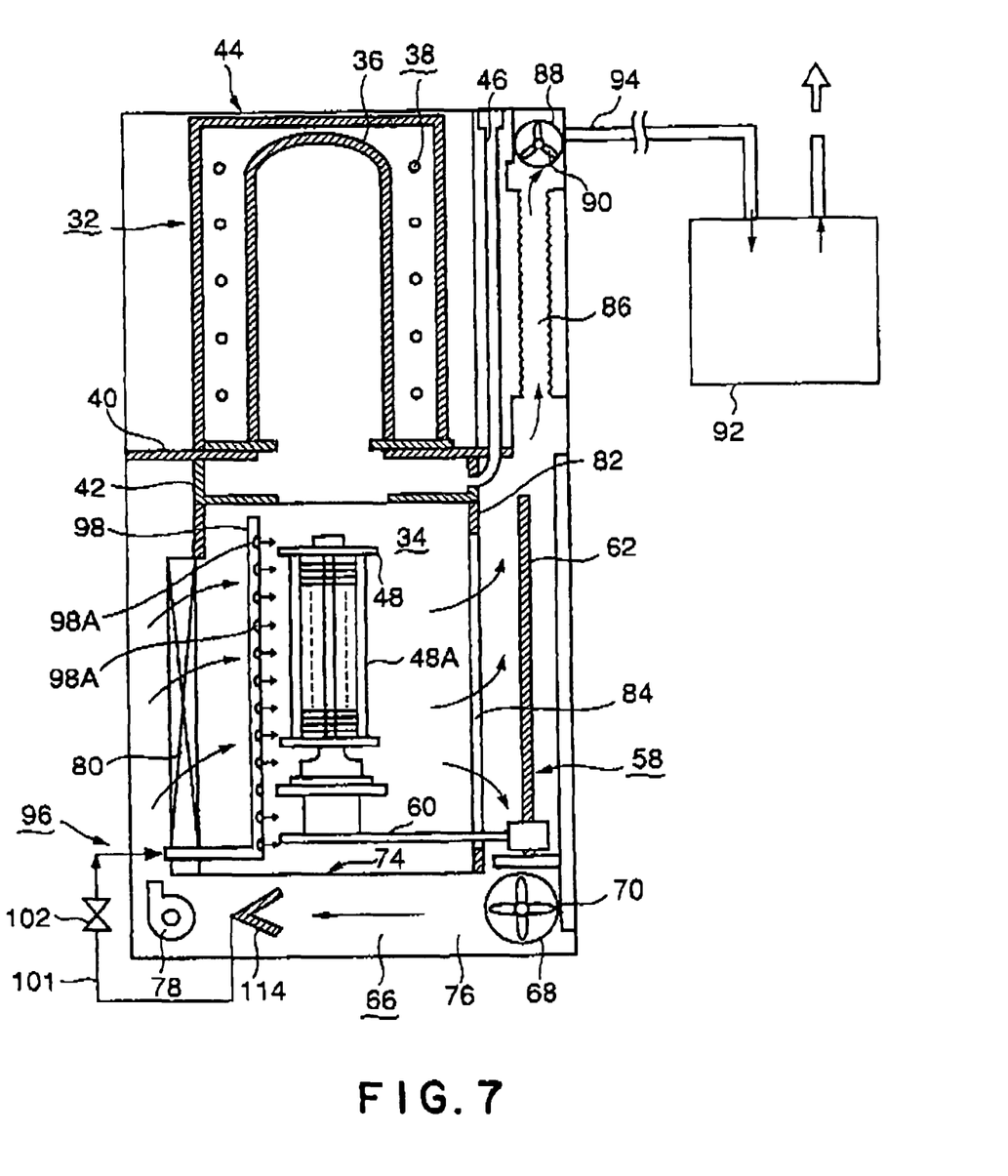
FIG. 7 is a schematic side view showing the overall configuration of a modified version of the film forming system according to the present invention.

In the foregoing embodiment, the clean gas supply source for supplying the clean gas to the jetting nozzle(s) 98 is arranged independently of the clean gas circulation system 66, but is not limited thereto, and a modification shown in FIG. 7 is possible. In FIGS. 2 and 7, the same reference numerals are assigned to the same elements. As shown in FIG. 7, the air flow path 76 below the standby space 34 is provided with a funnel-shaped gas collector 114, which collects part of the circulating clean gas and pressurize the same. The gas line 101 is connected to the gas collector 114 so that the pressurized clean gas is supplied to the jetting nozzle 98. In this modification, it is not necessary to provide a separate gas supply source for supplying the clean gas to be jetted.

In the foregoing embodiment, one support boat 48 is arranged in the standby space 34, but is not limited thereto, and two support boats 48, which is used alternately, may be provided in the standby space 34

The process objects are not limited to semiconductor wafers, and may be glass substrates, LCD substrates, or the like.

What is claimed is:

1. A film forming system comprising:
    a heat treatment furnace adapted to perform a film formation process and including a vertical heat processing vessel and a heater arranged around the processing vessel, the processing vessel being adapted to be evacuated and adapted to accommodate a plurality of process objects therein;
    a support boat adapted to support the plurality of process objects at vertical intervals;
    a boat elevating mechanism adapted to move the support boat vertically to allow the support boat to be loaded into and unloaded from the processing vessel;
    a standby space, arranged below the heat treatment furnace, where the process objects are carried into and removed from the support boat located below the processing vessel;
    a clean gas circulation system configured to generate a circulation flow of a clean gas which passes unidirectionally through the standby space at a flow velocity, the clean gas circulation system including a flow path and a fan for generating the circulation flow, the flow path having a first end opening into the standby space to allow circulation flow inflow the standby space and a second end opening into the standby space to allow circulation flow outflow the standby space;

a clean gas jetting system including a gas line branched from the flow path and a clean as jetting nozzle having gas jetting holes opening into the standby space at a location different from where the first end of the flow path opens into the standby space, the clean gas jetting system being configured to collect a part of the clean gas, configured to pressurize the clean gas thus corrected, configured to supply the clean gas thus pressurized to the clean gas jetting nozzle through the gas line, and configured to jet the clean gas thus supplied to the clean gas jetting nozzle toward the support boat, which is located in the standby space without carrying the process objects, at a jetting velocity higher than the flow velocity, from the clean gas jetting nozzle extending along a height direction of the support boat.

2. The film forming system according to claim 1, wherein the clean gas jetting nozzle is configured to jet the clean gas in a direction in which the circulation flow of the clean gas generated by the clean gas circulation system flows in the standby space.

3. The film forming system according to claim 1, wherein the gas jetting nozzle has a plurality of gas jetting holes positioned at different levels.

4. The film forming system according to claim 3, wherein the gas jetting holes are arranged such that the jetting holes jet the clean air toward a pillar of the support boat.

5. The film forming system according to claim 1, wherein the clean gas circulation system includes a flow path extending below the standby space, and the clean gas jetting system includes a gas collector provided in the flow path of the clean gas circulation system to collect and pressurize the part of the clean gas flowing through the flow path.

6. The film forming system according to claim 1, wherein the clean gas circulation system is configured to generate the circulation flow passing unidirectionally through the standby space at a flow velocity within a range of 0.25 to 0.35 msec, and the clean gas jetting system is configured to jet the clean gas toward the support boat from the gas jetting nozzle at a jetting velocity within a range of 4.0 to 7.0 msec.

* * * * *